United States Patent [19]

Anthony et al.

[11] 4,024,566
[45] May 17, 1977

[54] DEEP DIODE DEVICE

[75] Inventors: Thomas R. Anthony; Harvey E. Cline, both of Schenectady, N.Y.

[73] Assignee: General Electric Company, Schenectady, N.Y.

[22] Filed: Mar. 3, 1975

[21] Appl. No.: 554,590

Related U.S. Application Data

[62] Division of Ser. No. 411,009, Oct. 30, 1973, Pat. No. 3,902,925.

[52] U.S. Cl. .................................. 357/60; 357/45; 357/88; 357/89; 357/90
[51] Int. Cl.² .................. H01L 29/04; H01L 27/10
[58] Field of Search .................. 357/60, 45, 88, 89, 357/90

[56] References Cited

UNITED STATES PATENTS 2,813,048 11/1957 Pfann ............................. 357/60

Primary Examiner—Edward J. Wojciechowicz
Attorney, Agent, or Firm—Charles T. Watts; Joseph T. Cohen; Jerome C. Squillaro

[57] ABSTRACT

When an aluminum-rich droplet is migrated along the [100] axis of a silicon crystal during a thermal gradient zone melting operation, a droplet is displaced appreciably from its thermal trajectory by dislocations it encounters in the crystal. This random walk of the droplet is minimized to enable preservation of the registry of deep diode arrays by maintaining a unidirectional thermal gradient a few degrees off the [100] axis.

4 Claims, 7 Drawing Figures

DEEP DIODE DEVICE

This is a division of application Ser. No. 411,009, filed Oct. 30, 1973, now U.S. Pat. No. 3,902,925.

The present invention relates generally to the art of thermal gradient zone melting and is more particularly concerned with a novel method of preventing dislocations in a crystal from causing the random walk of a droplet migrating through the crystal, and with a new deep diode device having a P-N junction extending in a straight line into the crystal at an angle from 2° to 10° from the [100] axis of the crystal.

CROSS-REFERENCES

This invention is related to those of the following patents assigned to the assignee hereof and filed of even date herewith:

U.S. Pat. No. 3,901,736, issued Aug. 26, 1975, entitled "Method of Making Deep Diode Devices" in the names of Thomas R. Anthony and Harvey E. Cline, which discloses and claims the concept of embedding or depositing the solid source of the migrating species within the matrix body instead of on that body to overcome the tendency for migration to be irregular and to lead to non-uniformity in location and spacing of the desired P-N junctions.

U.S. Pat. No. 3,898,106, issued Aug. 5, 1975, entitled "High Velocity Thermomigration Method of Making Deep Diodes" in the names of Harvey E. Cline and Thomas R. Anthony, which discloses and claims the concept of carrying out thermal gradient zone melting at relatively high temperatures including temperatures approaching the melting point temperature of the material of the matrix body.

U.S. Pat. No. 3,910,801, issued Oct. 7, 1975, entitled "Deep Diode Device Production Method" in the names of Harvey E. Cline and Thomas R. Anthony, which discloses and claims the concept of using the high velocity thermomigration method to produce migration trails of recrystallized material running lengthwise of an elongated matrix body and then dividing the matrix into a number of similar deep diodes by cutting the matrix body transversely at locations along the length of the migration trails.

U.S. Pat. No. 3,899,361, issued Aug. 12, 1975, entitled "The Stabilized Droplet Method of Making Deep Diodes Having Uniform Electrical Properties" in the names of Harvey E. Cline and Thomas R. Anthony, which discloses and claims the concept of controlling the cross-sectional size of a migrating droplet on the basis of the discovery that 1 millimeter is the critical thickness dimension for droplet physical stability.

BACKGROUND OF THE INVENTION

Although the [100] direction is the most suitable to droplet thermal migration because of such factors as droplet stability and the ease of droplet penetration at the starting (100) vacuum-solid interface, it has been found in some instances that droplets migrated in that direction suffer relatively large mean square displacement. While this effect is comparatively small in both low and high density dislocation crystals, it is large enough in those of medium dislocation density (i.e., from $5 \times 10^4$ to $5 \times 10^7$ dislocations per square centimeter) to prevent production of relatively straight droplet migration trails and thus precludes the production of regular deep diode P-N junction arrays by the otherwise preferred [100] axis migration mode. Neither droplet size or mass nor maximum temperature or thermal gradient have any significant effect on this phenomenon.

SUMMARY OF THE INVENTION

We have discovered that the random walk displacement of migrating droplets can be accomplished generally along the [100] direction without unacceptable displacement as a consequence of dislocations in the crystal by adjusting the thermal gradient as to direction so that it is slightly off the [100] axis. This solves the problem stated above, even in cases where the departure from the [100] axis is as small as only 2 degrees and the crystal dislocation densities are in the maximum range in terms of mean square displacement of migrating droplets. Moreover, this result is obtained without incurring any offsetting disadvantage, the merits of the [100] direction migration being undiminished by such limited deviation.

We have also found the dislocation density in the droplet trails produced in accordance with this new method based on this discovery to be no greater than that of the displaced or random walk trails and invariably to be far less than the dislocation density of the surrounding matrix. No dislocation or dislocation network has been found in a droplet-trail matrix interface (i.e., P-N junction) in any of the deep diodes made in accordance with our discovery of the large effect of the small angular departure of the droplet migration direction from the [100] axis of the crystal matrix.

DESCRIPTION OF THE DRAWINGS

The method of this invention in preferred form and its important advantages are illustrated in the drawings and forming a part of this specification, in which.

DETAILED DESCRIPTION OF THE INVENTION

Figure 1:
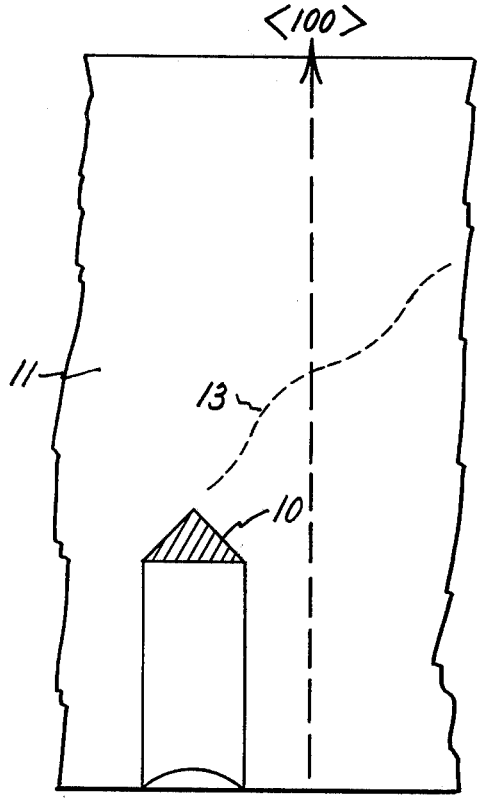
FIG. 1 is a conceptualization of the progress of themomigration of a metal droplet in the [100] direction in a silicon crystal.
Figure 2:
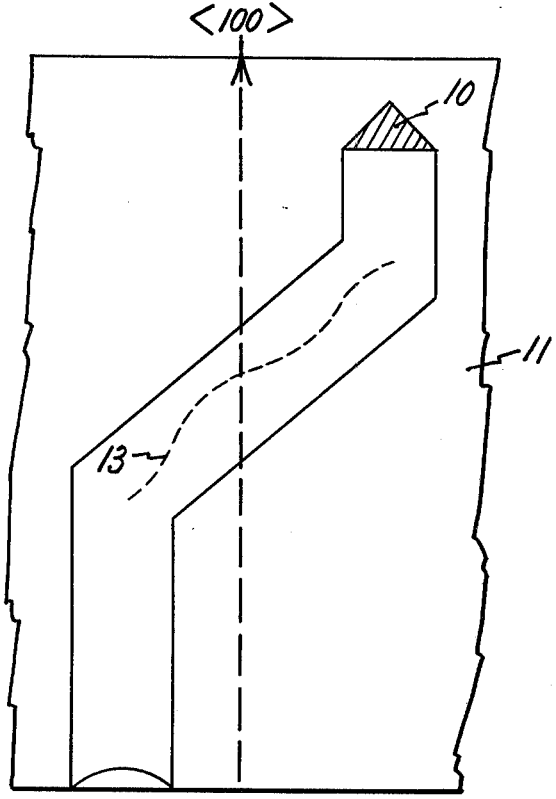
FIG. 2 is a view similar to that of FIG. 1 showing the next stages of migration of the droplet as it is displaced laterally from its intended course by a dislocation.

As illustrated in FIGS. 1 and 2, the thermomigration of a droplet of aluminum 10 in the [100] direction in a silicon crystal 11 is effected detrimentally by intersection with a dislocation 13 in the crystal. The random displacement which results as the pyramidal droplet encounters the dislocation can be well beyond a tolerable limit, particularly when there are a number of closely spaced droplets or where there is pattern integrity to be maintained throughout the thermomigration course.

Figure 3:
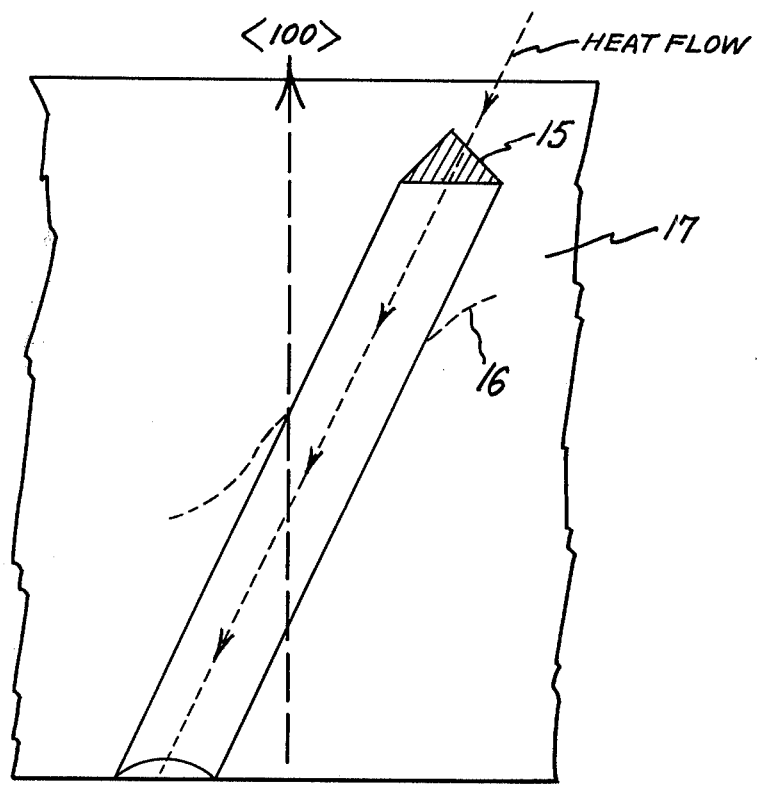
FIG. 3 is a view similar to FIGS. 1 and 2 illustrating migration of a metal droplet in accordance with the present invention along a straight line course through the crystal at a slight angle to the [100] direction.

By contrast, as shown in FIG. 3, there is no such displacement of the droplet 15 travel trajectory by a dislocation 16 when that trajectory make a small angle with the [100] axis of the crystal 17. Thus, while the trajectory is determined in both instances by the thermal gradient (i.e., the direction of heat flow through the crystal) and there is but a slight angular difference between them, the end results are totally different. Actually, that small difference represents the fundamental departure of this invention from the prior art in replacing random lateral displacements by a steady, non-random displacement of the migrating droplet from the [100] axis or direction. This non-random displacement may be toward the [010] direction. However, if the off-axis thermal gradient is toward the [011] direction, random displacement would still be induced by dislocation intersections in the ± [011] directions and would cause disintegration of an initially registered array of migrating liquid droplets.

FIGS. 2 and 3 are not consistent in respect to the illustration of the dislocation, it being shown as remaining in the trail of FIG. 2, but not in that of FIG. 3. Actually, dislocations are obliterated to the extent that they are traversed by droplet migration trails as illustrated in FIG. 3. The dislocation is shown in FIG. 2 for purposes of illustrating the nature and extent of the displacement effect that a dislocation can have on a migrating droplet.

Figure 5:
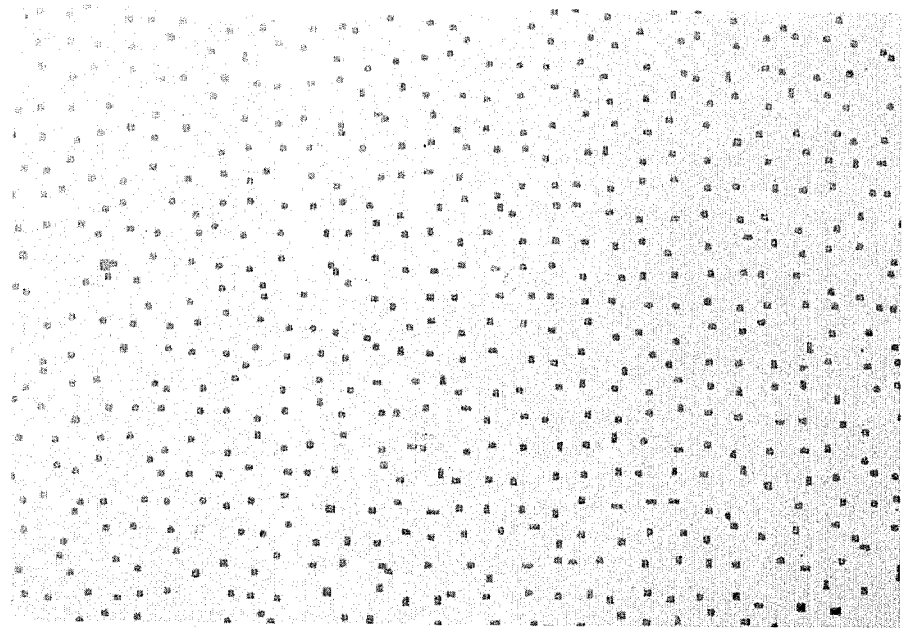
FIG. 5 is a photomicrograph like that of FIG. 4 showing the pattern of droplets emerging at the opposite surface of the FIG. 4 crystal.

Droplets migrating along the [100] direction are four-sided pyramids with apex pointed in the [100] direction, and they leave faceted rectangular trail cross sections behind them as seen to best advantage in FIG. 5. The trail is rectangular instead of being square because the four foward faces undergo uneven dissolution when a dislocation threads through two opposed forward faces, causing them to dissolve faster than the other pair of opposing faces and to spread outward with the result that the base of the droplet changes from a square to a rectangle.

Figure 7:
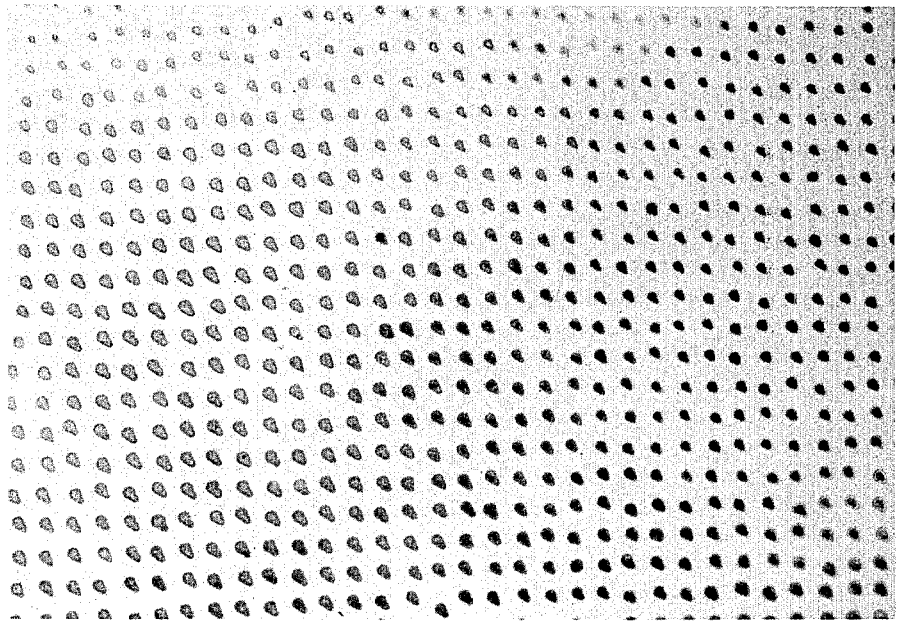

Trails of droplets migrated as illustrated in FIG. 3 appear rounded, as shown in FIG. 7. In this case, the off-axis thermal gradient is aligned in the [010] direction so that the forward two dissolving faces remain flat because of dissolution faceting. The trailing faces at the same time become curved because of deposition rounding and leave behind a curved trail perimeter. The net result is a tear-drop-like trail cross section as seen at the emerging face shown in FIG. 7.

To further inform those skilled in the art as to the best method of practicing this invention, we set forth below details concerning a number of experiments we have made in the course of testing the present invention method against the prior art practice.

Single crystal silicon ingots of [100] orientation and N-type semiconductivity (10 ohm-centimeter) 1 inch in diameter and containing from 10 to $10^5$ dislocations per square centimeter were sliced into 1-centimeter ingots 1 centimeter in length.

The dislocation densities in some of these ingots were increased to the order of $10^8$ dislocations per square centimeter by mechanical deformation to the extent of 1 percent at 1100° C.

These ingots were next polished, oxidized and patterned by photolithography and etched to produce a 50 × 50 square array of holes 30 microns deep on 20-mil centers. An aluminum fill was deposited into the hole arrays, these several operations being carried out as disclosed and claimed in our U.S. Pat. No. 3,901,736, issued Aug. 26, 1975.

EXAMPLE I

Using the method and apparatus disclosed and claimed in our copending patent application Ser. No. 552,154, filed Feb. 24, 1975 which is a continuation of our patent application Ser. No. 411,001, filed Oct. 30, 1973 (now abandoned), thermomigration of aluminum-rich droplets was carried out on the first group of ingots, the thermal gradient being aligned in the [100] direction. The actual temperature of the ingot on the side remote from the initial pattern was maintained at 945° C throughout the thermomigration period. At the conclusion of the thermomigration period, the ingot was ground and polished on both the entrance and exit sides with the results shown in FIGS. 4 and 5.

EXAMPLE II

Another batch of ingots prepared as described above were treated as described in Example I except that the thermal gradient was established and maintained throughout the thermomigration period at an angle of 2° to the [100] direction (toward the [010] direction). The product was similarly ground and polished with the results shown in FIGS. 6 and 7.

EXAMPLE III

A third batch of ingots prepared as described above were treated as described in Example I with the exception that the maximum temperature was maintained at 1330° C throughout the thermomigration period. Again, on grinding and polishing, the resulting products were observed to have the characteristics illustrated in FIGS. 4 and 5.

EXAMPLE IV

Figure 6:
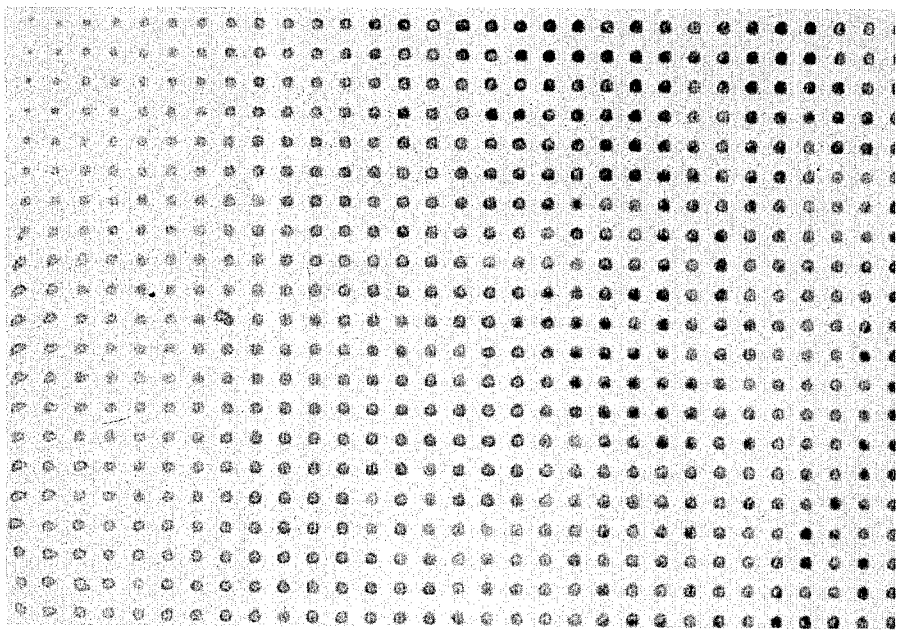
FIG. 6 is another photomicrograph like that of FIG. 4 showing the initial droplet source pattern within a surface of another silicon crystal; and, FIG. 7 is still another photomicrograph like that of FIG. 4 showing the pattern of emerging thermomigrated droplets on the opposite face of the crystal from that of FIG. 6.

In still another experiment at high temperature, ingots of another set prepared as described above were subjected to 1330° C maximum temperature throughout the thermomigration carried out otherwise as described in Example II. The resulting products were likewise ground and polished, and found on examination to be as shown in FIGS. 6 and 7.

EXAMPLE V

Figure 4:
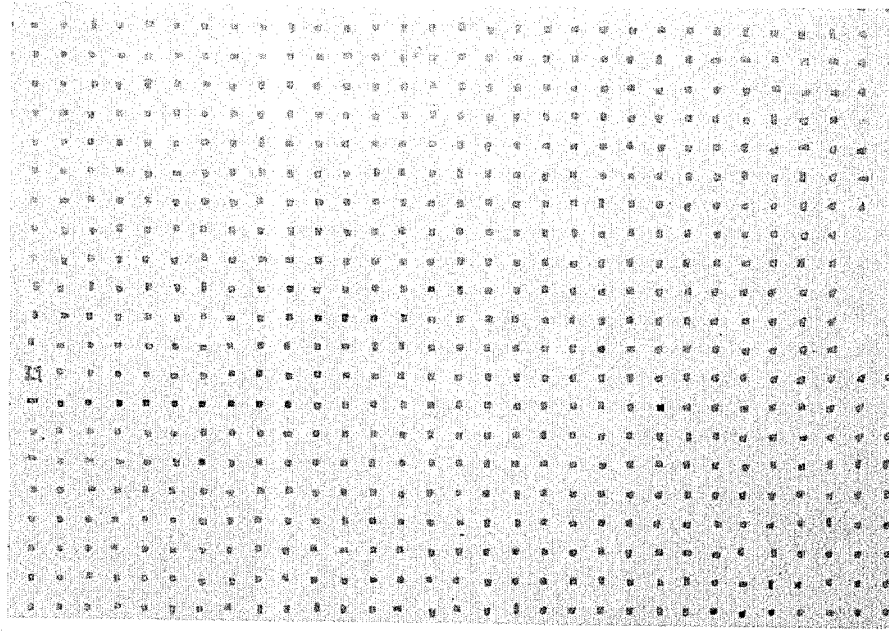
FIG. 4 is a photomicrograph (10× magnification) of a droplet source array in place within a surface portion of a silicon crystal.

In two parallel runs, the high dislocation density ingots were subjected in one group to the method of Example I and in another group to the method of this invention as described in Example II. The products of the first group were as shown in FIGS. 4 and 5 while those of the second group were as shown in FIGS. 6 and 7.

EXAMPLE VI

In another experiment to test the effect of a greater angular departure from the [100] direction, a number of ingots were subjected to the present invention method as described in Example II, except that the thermal gradient was at an angle of 10° to the [100] axis. The products were found to be substantially as shown in FIGS. 6 and 7.

In other runs of this kind, we have found that the random walk of migrating droplets resulting from encounters with dislocations in the semiconductor crystal matrix can be prevented through the use of this invention method regardless of the particular matrix material, the droplet material, droplet size or shape, the absolute or maximum temperature, the thermal gradient or the rate of droplet migration. This invention is consequently applicable to the whole range of semiconductor crystal matrix materials and metal migrating materials. Thus, the wafer or workpiece semiconductor material body used in this invention process may be other than silicon, such as silicon carbide, germanium, gallium arsenide, a compound of a Group II element and a Group VI element, or a compound of a Group III element and a Group V element. Likewise, the material of the migrating species can be other than pure or suitably doped aluminum which is fusible and capable of forming a liquid solution with the material of the matrix body or wafer to provide a recrytallized region of selected conductivity and resistivity different from that of the wafer as it is migrated therethrough. If the conductivity is opposite to that of the matrix material, a P-N junction would be created at the interface of the two different materials. Also, the wafer or matrix body material and the migratint species should be selected so as to insure that the melting point temperature of the former is above, and preferably substantially above, the melting point temperature of the liquid solution of the migrating species material and the wafer or matrix body material.

In the method of this invention, the trails left by the migrating droplet are actually regions of recrystallized material extending part way or all the way through the semiconductor matrix body crystal. The conductivity and resistivity of the crystal and the recrystallized region in each instance will be different so that these trails or recrystallized regions will form with the matrix body crystal P-N junctions suitably of the step type if desired. Alternatively, they may serve instead as leadthroughs if P-N junction characteristic does not exist in the structure. Recrystallized regions thus may be suitably doped with the material comprising the migrating droplet, that is, in admixture with the droplet metal, so as to provide impurity concentration sufficient to obtain the desired conductivity. The metal retained in the recrystallized region in each instance is substantially the maximum allowed by the solid solubility in the semiconductive material. Further, such recrystallized region has a constant uniform level of impurity concentration throughout the length of the region or trail and the thickness of the recrystallized region is substantially constant throughout its depth or length.

While in the foregoing examples it has been indicated that the aluminum source of migrating droplet material was deposited under a vacuum of $1 \times 10^{-5}$ torr, it is to be understood that other vacuum conditions may be employed, particularly higher vacuums, and that lesser vacuums down to $3 \times 10^{-5}$ torr may be used with satisfactory results. We have found, however, that particularly in the case of aluminum, difficulty may be encountered in initiating droplet migration due to interference of oxygen with wetting of silicon by the aluminum when pressures greater than $3 \times 10^{-5}$ torr are used in this operation. Similarly, aluminum deposited by sputtering will by virtue of saturation by difficult to use in this process of ours so far as initiation of the droplet penetration action is concerned. It is our preference, accordingly, for an aluminum deposition procedure which prevents more than inconsequential amounts of oxygen from being trapped in the aluminum deposits.

As a general proposition in carrying out the process of this invention and particularly the stage of forming the recesses or pits in the surface of the matrix body crystal to receive deposits of solid droplet source material, the depth of the recesses should not be greater than about 25 to 30 microns. This is for the purpose of avoiding the undercutting of the masking layer which would be detrimental in that the width of the droplet to be migrated might be too great or, in the extreme case, that the contact between the droplet and the matrix body surface would be limited to the extent that initiation of migration would be difficult and uncertain. In the normal use of the present invention process, the etching operation providing these recesses will be carried on for approximately 5 minutes at a temperature of 25° C to provide a recess depth of about 25 microns with a window opening size of from 10 to 500 microns according to the size of the opening defined by the mask.

What we claim as new and desired to secure by Letters Patent of the United States is:

1. A deep diode device comprising a matrix body of semiconductive material of first-type semiconductivity in the form of a single crystal having <100> axial orientation, a recrystallized region of semiconductive material of a second-type semiconductivity extending in a straight line into the matrix body, and a P-N junction at the interface between the matrix body crystal and the recrystallized region having its major axis disposed at an angle of 2° to 10° from the <100> axis of the single crystal toward a direction selected from the group consisting of the <010> and the <001> direction, said recrystallized region of semiconductive material being formed in situ by the migration of a melt of a metal-rich semiconductor material through the matrix body at a predetermined elevated temperature along a thermal gradient and being of substantially constant thickness throughout its length and having a constant uniform level of impurity concentration throughout its length as determined by the solid solubility limit of that metal of the melt in that semiconductor material of that matrix body at that predetermined elevated temperature of migration.

2. The device of claim 1 in which the single crystal is silicon having medium dislocation density from $5 \times 10^4$ to $5 \times 10^7$ dislocations per square centimeter.

3. The device of claim 1 in which there are a plurality of recrystallized regions extending through the matrix body in straight lines parallel to each other.

4. The device of claim 1 in which the P-N junction extends through the matrix body substantially from one side to another of the single crystal and is free from random displacements.

* * * * *